United States Patent
Liu

(10) Patent No.: US 11,041,889 B2
(45) Date of Patent: Jun. 22, 2021

(54) METHOD FOR ESTIMATING LOAD CURRENT OF POWER SUPPLY, AND USB-TYPE CONVERTER

(71) Applicant: SHENZHEN LEGENDARY TECHNOLOGY CO., LTD, Guangdong (CN)

(72) Inventor: Xiaoling Liu, Guangdong (CN)

(73) Assignee: SHENZHEN LEGENDARY TECHNOLOGY CO., LTD, Guangdong (CN)

( * ) Notice: Subject to any disclaimer, the term of this patent is extended or adjusted under 35 U.S.C. 154(b) by 0 days.

(21) Appl. No.: 16/758,266

(22) PCT Filed: Jan. 9, 2018

(86) PCT No.: PCT/CN2018/071846
§ 371 (c)(1),
(2) Date: Apr. 22, 2020

(87) PCT Pub. No.: WO2019/080372
PCT Pub. Date: May 2, 2019

(65) Prior Publication Data
US 2020/0341036 A1    Oct. 29, 2020

(30) Foreign Application Priority Data
Oct. 23, 2017    (CN) .................. 201710992039.X

(51) Int. Cl.
*G01R 19/165*    (2006.01)
*H01R 31/06*    (2006.01)
(Continued)

(52) U.S. Cl.
CPC ..... *G01R 19/16538* (2013.01); *H01R 31/065* (2013.01); *H02J 7/00712* (2020.01); *H01R 13/6675* (2013.01); *H01R 13/6683* (2013.01)

(58) Field of Classification Search
CPC ............ H01R 13/6675; H01R 13/6683; H01R 31/065; G01R 19/16571; G01R 19/16538; G01R 1/206; H02J 7/00712
(Continued)

(56) References Cited

U.S. PATENT DOCUMENTS

| 5,493,657 | A  | * | 2/1996 | Van Brunt | .......... G06F 13/4072 |
|-----------|----|---|--------|-----------|--------------------------|
|           |    |   |        |           | 710/305                  |
| 6,252,375 | B1 | * | 6/2001 | Richter   | ................ G06F 1/266 |
|           |    |   |        |           | 320/127                  |

(Continued)

FOREIGN PATENT DOCUMENTS

| CN | 103066666   |   | 4/2013 |             |
|----|-------------|---|--------|-------------|
| CN | 103066666 A | * | 4/2013 | ........ H02J 7/007184 |

(Continued)

OTHER PUBLICATIONS

International Search Report issued in PCT/CN2018/071846, dated Jul. 13, 2018l.

(Continued)

*Primary Examiner* — Patrick Assouad
*Assistant Examiner* — Sean Curtis
(74) *Attorney, Agent, or Firm* — Barnes & Thornburg LLP; Jeffrey R. Stone

(57) ABSTRACT

Disclosed are a method for estimating a load current of a power supply, and a USB-type converter. The method includes steps described below. After an input port of a USB connection line is connected to the power supply and an output port of the USB connection line is connected to a load, the power supply supplies power to the load through the USB connection line to obtain an initial load current value; an actual voltage value of the input port is detected, when the actual voltage value of the input port is less than a preset voltage value, the initial load current value is
(Continued)

adjusted until the actual voltage value of the input port corresponding to an adjusted load current value is not less than the preset voltage value, and the adjusted load current value is output as a load current value of the power supply.

15 Claims, 4 Drawing Sheets

(51) Int. Cl.
  *H01R 13/66* (2006.01)
  *H02J 7/00* (2006.01)
(58) Field of Classification Search
  USPC .................................................. 324/429, 705
  See application file for complete search history.

(56) References Cited

U.S. PATENT DOCUMENTS

| | | | | |
|---|---|---|---|---|
| 7,528,582 B1 * | 5/2009 | Ferguson | ................. | H02J 7/045 320/164 |
| 8,049,462 B2 * | 11/2011 | Kung | .................... | H02J 7/0031 320/111 |
| 8,108,694 B2 * | 1/2012 | Gilbert | .................... | G06F 1/266 713/300 |
| 8,138,731 B2 * | 3/2012 | Chen | .................... | H02M 3/1584 323/272 |
| 8,193,779 B2 * | 6/2012 | Ferguson | ................. | H02J 7/045 320/163 |
| 8,405,370 B2 * | 3/2013 | Chen | .................... | H02M 3/1584 323/272 |
| 9,110,652 B2 * | 8/2015 | Shen | ....................... | G06F 1/266 |
| 9,167,853 B2 * | 10/2015 | Xiang | .................... | H02J 7/0091 |
| 9,438,049 B2 * | 9/2016 | Xiang | .................... | H02J 7/007 |
| 9,651,583 B2 * | 5/2017 | Kawase | ............... | G01R 15/207 |
| 10,303,192 B2 * | 5/2019 | Pons | ....................... | H01R 24/60 |
| 10,445,281 B2 * | 10/2019 | Trichy | ................. | G06F 13/4282 |
| 2008/0222432 A1 * | 9/2008 | Gilbert | ............... | H01R 13/6675 713/300 |
| 2009/0102431 A1 * | 4/2009 | Kung | .................... | H02J 7/0031 320/162 |
| 2010/0133908 A1 * | 6/2010 | Weng | ....................... | G06F 1/266 307/48 |
| 2010/0244788 A1 * | 9/2010 | Chen | .................... | H02M 3/1584 323/234 |
| 2012/0112716 A1 * | 5/2012 | Chen | .................... | H02M 3/1584 323/271 |
| 2014/0101345 A1 * | 4/2014 | Ranta | .................... | G06F 11/3051 710/16 |
| 2014/0375305 A1 * | 12/2014 | Kawase | ............. | H01R 13/6683 324/140 R |
| 2015/0015186 A1 * | 1/2015 | Xiang | .................... | H02J 7/0091 320/107 |
| 2017/0336819 A1 * | 11/2017 | Pons | ....................... | H01R 24/60 |
| 2019/0067883 A1 * | 2/2019 | Yilmaz | ................. | H01R 25/006 |
| 2019/0280508 A1 * | 9/2019 | Tabib | ................. | G01R 31/3842 |
| 2019/0319545 A1 * | 10/2019 | Wang | .................... | G06F 1/3206 |
| 2019/0341786 A1 * | 11/2019 | Lee | ........................ | G06F 1/3275 |
| 2020/0341036 A1 * | 10/2020 | Liu | ....................... | H01R 31/065 |

FOREIGN PATENT DOCUMENTS

| | | | | |
|---|---|---|---|---|
| CN | 106340910 | | 1/2017 | |
| CN | 106340910 A | * | 1/2017 | |
| CN | 106972736 | | 7/2017 | |
| WO | WO-2019080372 A1 | * | 5/2019 | ............... H02J 7/00 |

OTHER PUBLICATIONS

Written Opinion issued by the International Searching Authority in PCT Application No. PCT/CN2018/071846 dated Jul. 13, 2018. An full English translation is included.

* cited by examiner

METHOD FOR ESTIMATING LOAD CURRENT OF POWER SUPPLY, AND USB-TYPE CONVERTER

CROSS-REFERENCE TO RELATED APPLICATIONS

This is a National Stage Application, filed under 35 U.S.C. 371, of International Patent Application No. PCT/CN2018/071846, filed on Jan. 9, 2018, which claims the priority of Chinese patent application No. 201710992039.X, filed on Oct. 23, 2017, contents of both of which are incorporated herein by reference in its entirety.

TECHNICAL FIELD

The present disclosure relates to the fields of charging and USB-type conversion and, in particular, to a method for estimating a load current of a power supply and a USB-type converter.

BACKGROUND

As more and more intelligent terminals support an intelligent power supply mode based on a C-type universal serial bus (USB) interface, the traditional type of USB interface chargers will be gradually eliminated, which will waste a great amount of social stock resources.

In order to convert different types of USB interfaces into the C-type USB interface, a manner is to perform an interface form conversion, which can directly implement conversions of different types of USB interfaces. However, since output capability of a power supply cannot be accurately informed to an electrical appliance by this kind of the interface form conversion, the intelligent charging cannot be achieved, which even causes damage of the USB interface.

SUMMARY

The present disclosure provides a method for estimating a load current of a power supply and a USB-type converter, so as to achieve capability of real-time monitoring and estimating electric energy output by an input port, provide the electric energy to an output port as the power supply for a load without damaging an adapter connected to the input port.

The present disclosure provides a method for estimating a load current of a power supply. The method is applied to a USB connection line and includes steps described below.

After an input port of the USB connection line is connected to the power supply and an output port of the USB connection line is connected to a load, the power supply supplies power to the load through the USB connection line to obtain an initial load current value;

an actual voltage value of the input port is detected, when the actual voltage value of the input port is less than a preset voltage value, the initial load current value is adjusted until the actual voltage value of the input port corresponding to an adjusted load current value is not less than the preset voltage value, and the adjusted load current value is output as a load current value of the power supply.

In an embodiment, before the initial load current value is adjusted each time, the method further includes a step described below.

A connection between the input port and the output port in the USB connection line is disconnected; and before the actual voltage value of the input port corresponding to the adjusted load current value is obtained each time, the method further includes a step described below.

The connection between the input port and the output port in the USB connection line is restored.

In an embodiment, the input port includes at least one input port;

when one input port is connected to the power supply, the actual voltage value of the input port is an actual voltage value of the one input port, and the preset voltage value is a default voltage value corresponding to the power supply which is connected to the one input port; and when at least two input ports are connected to at least two power supplies in one-to-one correspondence, the actual voltage value of the input port is a sum of actual voltage values of the at least two input ports, and the preset voltage value is a sum of default voltage values corresponding to the at least two power supplies.

In an embodiment, the output port includes at least one output port;

when one output port is connected to the load, power is supplied to the load connected to the one output port to obtain the initial load current value; and when at least two output ports are connected to at least two loads in one-to-one correspondence, power is supplied to the at least two loads connected to the at least two output ports to obtain at least two sub-initial load current values, where the initial load current value is a sum of the at least two sub-initial load current values.

The present disclosure further provides a USB-type converter. The USB-type converter includes an input port, an output port and a power supply load capability estimation unit.

The input port is configured to be connected to a power supply;

the output port is configured to be connected to a load; and the power supply load capability estimation unit is configured to detect an actual voltage value of the input port, when the power supply supplies power to the load through a USB connection line to obtain an initial load current value; the power supply load capability estimation unit is configured to adjust the initial load current value, when the actual voltage value of the input port is less than a preset voltage value, and until the actual voltage value of the input port corresponding to an adjusted load current value is not less than the preset voltage value, the power supply load capability estimation unit is configured to output the adjusted load current value as a load current value of the power supply.

In an embodiment, the power supply load capability estimation unit includes a control circuit, a switch circuit and a voltage detection circuit.

The control circuit includes a set value sending port, a voltage acquisition port, an enable output end and a comparison circuit; the set value sending port is connected to the output port and is configured to obtain an initial load current value; the voltage acquisition port, which serves as a first input end of the control circuit, is connected to the voltage detection circuit and is configured to acquire the actual voltage value of the input port; the comparison circuit is connected to the voltage acquisition port and is configured to: receive the actual voltage value of the input port, and compare the actual voltage value of the input port with the preset voltage value stored in the control circuit to form a control signal which is output by the enable output end of the control circuit;

when the actual voltage value of the input port is less than the preset voltage value, the enable output end of the control circuit outputs a first control signal to adjust the initial load current value and obtain an adjusted load current value; and when the actual voltage value of the input port is not less than the preset voltage value, the enable output end of the control circuit outputs a second control signal;

the switch circuit is connected to a voltage bus, and the enable output end of the control circuit is connected to an enable input end of the switch circuit;

the voltage detection circuit, which is connected between the voltage bus and a ground and connected to the voltage acquisition port of the control circuit, is configured to: detect the actual voltage value of the input port and send the actual voltage value of the input port to the voltage acquisition port of the control circuit.

In an embodiment, the voltage detection circuit includes a first resistor and a second resistor. The first resistor and the second resistor are connected in series. One end of the series-connected resistors is connected to the voltage bus, and the other end of the series-connected resistors is connected to the ground. The voltage acquisition port is connected between the first resistor and the second resistor.

In an embodiment, the control circuit further includes a second input end;

the power supply load capability estimation unit further includes a current detection circuit. The current detection circuit is configured to detect an actual load current value of the output port and send the actual load current value to the second input end of the control circuit, such that the control circuit determines whether the actual load current value reaches the initial load current value. When the actual load current value reaches the initial load current value, the voltage detection circuit detects the actual voltage value of the input port;

the current detection circuit is connected to the voltage bus or the ground, such that the current detection circuit and the load form a series branch, and the second input end of the control circuit is connected between the current detection circuit and the output port.

In an embodiment, the input port includes at least one of a USB-A male header, a USB-B male header, a USB-C male header, a lightning interface male header, a micro USB female seat or a lightning female seat.

In an embodiment, the output port is a USB-C female seat, and the set value sending port of the control circuit outputs a load current through a first control line or a second control line of the USB-C female seat.

In the present disclosure, the actual voltage value output by the input port is monitored and estimated in real time, when the actual voltage value of the input port is less than the preset voltage value, the initial load current value is adjusted until the actual voltage value of the input port corresponding to the adjusted load current value is not less than the preset voltage value, and the adjusted load current value is output as the load current value of the power supply, so that the input port is prevented from being damaged due to overload, and an effect of the intelligent charging is achieved. The intelligent conversion of different types of USB interfaces is achieved by the USB-type converter, so as to maximize utilization of different types of adapters.

DETAILED DESCRIPTION

Figure 1:
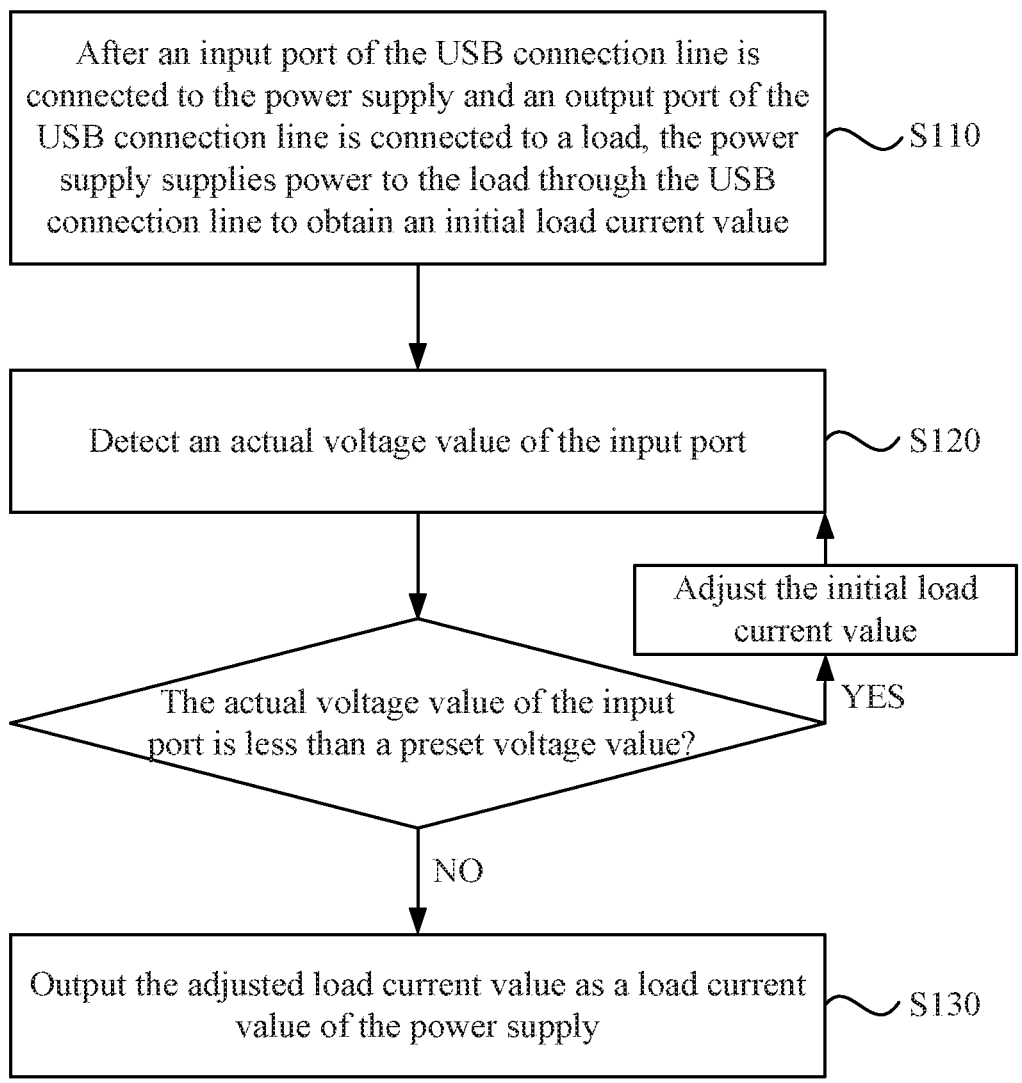
FIG. 1 is a flowchart of a method for estimating a load current of a power supply according to an embodiment.

FIG. 1 is a flowchart of a method for estimating a load current of a power supply according to an embodiment. The present embodiment is used for a USB connection line, and is applicable to a case where a USB interface type needs to be converted. The method may be executed by a USB-type converter, and the method includes steps described below.

In S110, after an input port of the USB connection line is connected to the power supply and an output port of the USB connection line is connected to a load, the power supply supplies power to the load through the USB connection line to obtain an initial load current value.

In an embodiment, the initial load current value in an embodiment of the present disclosure may also be used as a set value for current load capability.

In an embodiment, the input port is connected to the power supply, and the output port is connected to the load, thereby a circuit between the power supply and the load is formed (that is, the input port of the USB connection line may be connected to the power supply, and the output port of the USB connection line may be connected to the load, the circuit between the power supply and the load is formed). The set value for current load capability is a preset value, which may be set in advance, and this set value may be any positive number. After the input port of the USB connection line is connected to the power supply and the output port of the USB connection line is connected to the load, the power supply outputs electric energy corresponding to the set value for current load capability to the load (that is, the set value for current load capability may be a preset value obtained under a condition that the power supply provides preset electric energy to the load, the preset value for example may be any positive number. After the input port of the USB connection line is connected to the power supply and the output port of the USB connection line is connected to the load, the power supply supplies power to the load through the USB connection line). For example, when the power supply supplies power to the load through the USB connection line, the obtained set value for current load capability may be 3 A or 5 A, and a numerical value of the set value for current load capability is not limited in the embodiments of the present disclosure.

In S120, an actual voltage value of the input port is detected, when the actual voltage value of the input port is less than a preset voltage value, the initial load current value is adjusted until the actual voltage value of the input port corresponding to an adjusted load current value is not less than the preset voltage value.

In an embodiment, the load current value in an embodiment of the present disclosure may also be used as the current load capability.

In an embodiment, after the power supply supplies power to the load through the USB connection line to obtain the initial load current value, the actual voltage value of the input port may be detected. When the actual voltage value of the input port is less than the preset voltage value, for example, the preset voltage value may be 4.75 V defined by USB standard. If the actual voltage value of the input port is less than 4.75 V, which may be means that the set value for current load capability at this time exceeds load capability of the input port, therefore the set value for current load capability may be adjusted (that is, the initial load current value is adjusted). In an embodiment, an adjustment of the initial load current value may be performed by communications with the load through USB power delivery (USB PD) protocol, so as to reduce the initial load current value. In order to improve the actual voltage value of the input port, the adjusted set value for current load capability may be less than the set value for current load capability before adjustment according to theoretical basis of input power equal to output power. Under a condition of the adjusted set value for current load capability, the actual voltage value of the input port is re-detected, the above-mentioned determination process is continued until the actual voltage value of the input port corresponding to the adjusted set value for current load capability is not less than the preset voltage value, at this time, the set value for current load capability is within the range of the load capability of the input port. That is, since a resistance value in the circuit remains unchanged, when a detected actual voltage value of the input port is not less than the preset voltage value, adverse effects on circuit devices and power supply caused by an overlarge current in a circuit in which the power supply is connected to the load may be significantly avoided.

In S130, the adjusted load current value is output as a load current value of the power supply.

In an embodiment, the load current value of the power supply in an embodiment of the present disclosure may also be used as load capability of the power supply.

Herein, the load current value of the power supply may be the best fit current value, which is a load current value obtained when the power supply supplies power to the load through the USB connection line, and this obtained load current value will not cause adverse effects on any device and power supply in the circuit. Therefore, the load current value may be continuously adjusted to detect the actual voltage value of the input port of the USB connection line, and a corresponding load current value satisfying the preset voltage value is used as the load current value of the power supply.

In this embodiment, the actual voltage value output of the input port is detected in real time, when the actual voltage value of the input port is less than the preset voltage value, the set value for current load capability is adjusted until the actual voltage value of the input port corresponding to the adjusted set value for current load capability is not less than the preset voltage value, and the adjusted set value for current load capability is output as the load capability of the power supply. The method provided by the present embodiment may accurately inform the load of voltage output capability and current output capability of a power adapter connected to the input port of the USB connection line, so as to ensure that the power adapter connected to the input port of the USB connection line will not be damaged due to overload, and the effect of the intelligent charging is achieved.

In an embodiment, before the set value for current load capability is adjusted each time, the method may further include a step described below.

An access load is reset, the reset may include that a connection between the input port and the output port in the USB connection line is disconnected.

Correspondingly, before the actual voltage value of the input port corresponding to the adjusted set value for current load capability is obtained each time, the method may further include a step described below.

The connection between the input port and the output port in the USB connection line is restored.

When the actual voltage value of the input port is less than the preset voltage value, the set value for current load capability at this time exceeds the load capability of the input port, therefore, in order to avoid an overload operation of the input port, the connection between the input port and the output port in the USB connection line may be disconnected in time.

In an embodiment, after the set value for current load capability is adjusted, in order to detect the actual voltage value of the input port corresponding to the adjusted set value for current load capability, the input port is needed to output electric energy corresponding to the adjusted set value for current load capability to the output port, therefore, the connection between the input port and the output port may be restored. That is, after the initial load current value is adjusted, the connection between the input port and the output port in the USB connection line may be restored, such that the power supply supplies power to the load, so as to verify whether the adjusted load current value may be used as the load current value of the power supply.

In an embodiment, the input port includes at least one input port.

When one input port is connected to the power supply, the actual voltage value of the input port is an actual voltage value of the one input port, and the preset voltage value is a default voltage value corresponding to the power supply which is connected to the one input port;

when at least two input ports are connected to at least two power supplies in one-to-one correspondence, the actual voltage value of the input port is a sum of actual voltage values of the at least two input ports, and the preset voltage value is a sum of voltage preset values corresponding to the at least two power supplies.

In an embodiment, a default voltage value of a power supply in an embodiment of the present disclosure may also be used as a voltage preset value corresponding to the power supply.

In an embodiment, when one input port is connected to the power supply, the preset voltage value may be a default voltage value, which is the power that the power supply supplies to the load in an initial stage, or a voltage value requested by the load obtained by communications through the USB PD protocol. For example, if the default voltage value of the power supply is 5V, the preset voltage value may be the default voltage value of the power supply as 5V. However, when the detected actual voltage value of the input port is less than the preset voltage value, the initial load current is adjusted, so that the preset voltage value may be a voltage value requested by the load after the control circuit communicates with the load through the USB PD protocol, such as 9V.

In an embodiment, when the USB connection line adopts multiple input ports, the actual voltage value of the input port may be a sum of actual voltage values of all input ports connected to the power supply. Therefore, if no change is wanted for the set value for current load capability (the initial load current value), a number of the input port may be increased, such that an actual voltage value of each of the multiple input ports is less than the preset voltage value. Because multiple power supplies collectively supply power to the load, a voltage is divided by the multiple input ports connected to the power supply, such that the actual voltage value of the input port of the USB connection line may be increased without adjusting the set value for current load capability, thus the load capability of the input port may be improved.

In an embodiment, the output port includes at least one output port.

When one output port is connected to the load, the set value for current load capability may be sent to the output port connected to the load;

when at least two output ports are connected to at least two loads in one-to-one correspondence, the set value for current load capability may be sent to the at least two output ports, then a sum of sub-set values for current load capability corresponding to the at least two output ports is equal to the set value for current load capability.

That is, when the one output port is connected to the load, power is supplied to the load connected to the one output port to obtain the initial load current value; when the at least two output ports are connected to the at least two loads in one-to-one correspondence, power is supplied to the at least two loads connected to the at least two output ports to obtain at least two sub-initial load current values, where the initial load current value is a sum of the at least two sub-initial load current values.

In an embodiment, when multiple output ports are connected to multiple loads in one-to-one correspondence, the sum of the sub-set values for current load capability corresponding to the multiple output ports may be equal to the set value for current load capability. That is, since one input port of the USB connection line corresponds to multiple output ports, such that the voltage is divided by the multiple output ports connected to the multiple loads, therefore the power supply may simultaneously supplies power to the multiple loads, and charging time is saved.

Figure 2:
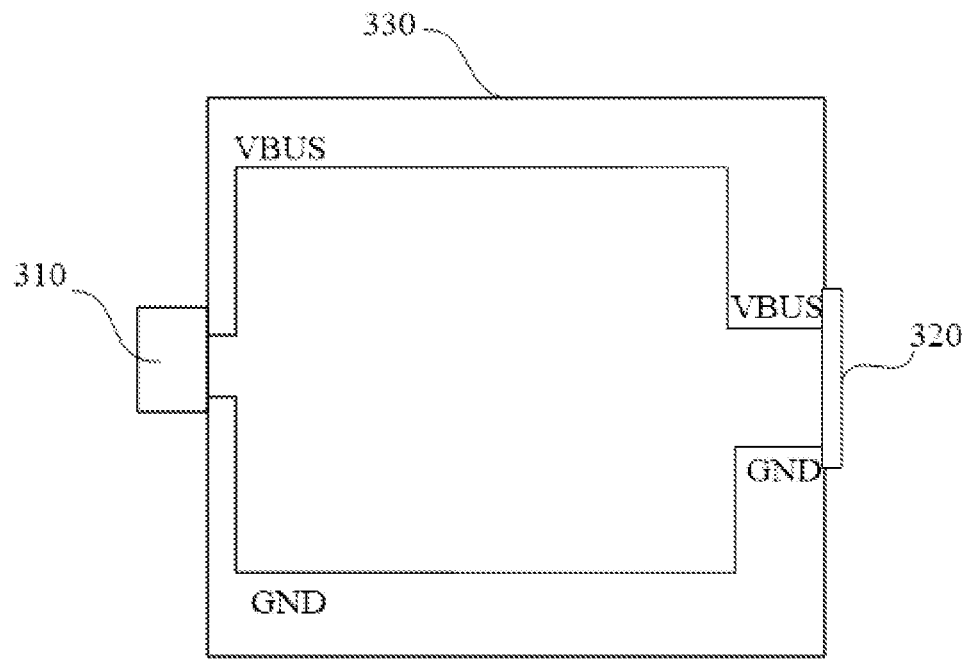
FIG. 2 is a schematic diagram of an internal structure of a USB-type converter according to an embodiment.

FIG. 2 is a schematic diagram of an internal structure of a USB-type converter according to an embodiment, this embodiment is applicable to a case where a USB interface type needs to be converted. A structure of a USB-type converter may include an input port 310, an output port 320 and a power supply load capability estimation unit 330.

The input port 310 is configured to be connected to a power supply;

the output port 320 is configured to be connected to a load;

the input port 310 and the output port 320 are connected through a voltage bus (VBUS) and a ground (GND);

the power supply load capability estimation unit 330 is configured to detect an actual voltage value of the input port, when the power supply supplies power to the load through a USB connection line to obtain an initial load current value; when the actual voltage value of the input port is less than a preset voltage value, the power supply load capability estimation unit 330 is configured to adjust the initial load current value until the actual voltage value of the input port corresponding to an adjusted load current value is not less than the preset voltage value, and to output the adjusted load current value as a load current value of the power supply.

The USB-type converter provided by this embodiment may accurately inform the output port of output capability of the input port of the USB connection line, so as to ensure that the input port will not be damaged due to overload, and realize the effect of the intelligent charging. The intelligent conversion of different types of USB interfaces is implemented by the USB-type converter, so as to maximize utilization of different types of adapters.

Figure 3:
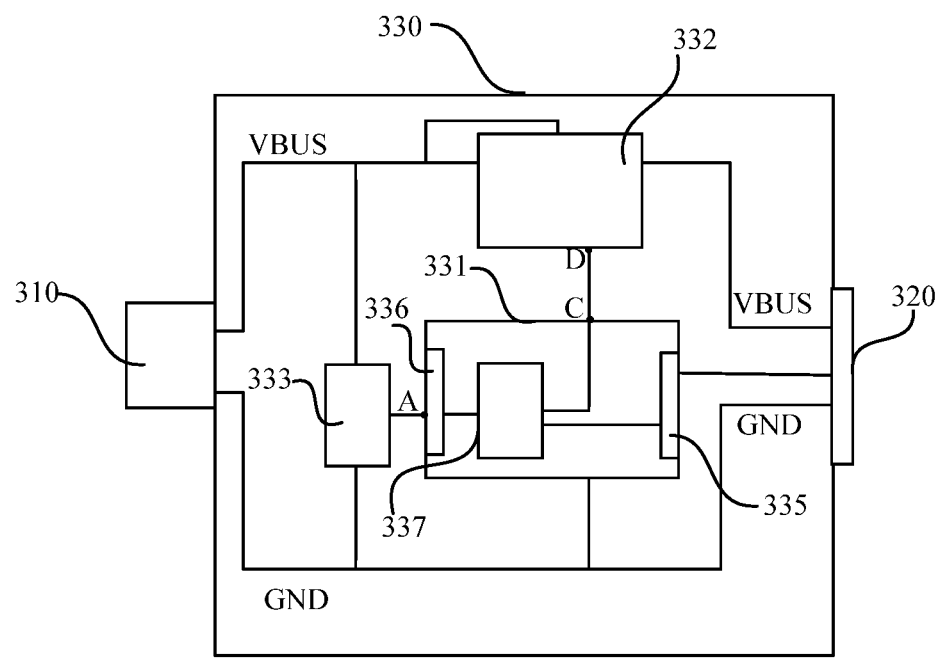
FIG. 3 is a schematic diagram of an internal structure of a USB-type converter according to another embodiment.

FIG. 3 is a schematic diagram of an internal structure of a USB-type converter according to an embodiment. In an embodiment, the USB-type converter may further include the input port 310, the output port 320, the power supply load capability estimation unit 330, a control circuit 331, a switch circuit 332, a voltage detection circuit 333, a set value sending port 335, a voltage acquisition port 336, a comparison circuit 337, a first input end A, an enable output end C and an enable input end D.

In an embodiment, the control circuit 331 may include the set value sending port 335, the voltage acquisition port 336 and the comparison circuit 337. The set value sending port 335 connected to the output port 320 may be configured to send a set value for current load capability to the output port 320 (that is, may be configured to obtain an initial load current value). The voltage acquisition port 336 which serves as the first input end A of the control circuit 331 is connected to the voltage detection circuit 333 and may be configured to acquire an actual voltage value of the input port 310 under the set value for current load capability through the voltage detection circuit 333. The comparison circuit 337 connected to the voltage acquisition port 336 may be configured to: receive the actual voltage value of the input port 310 sent by the voltage acquisition port 336, and compare an actual voltage value of the input port 310 with the preset voltage value stored in the control circuit 331 to form a control signal which is output by the enable output end C of the control circuit 331. Herein, the preset voltage value stored in the control circuit 331 may be stored in the comparison circuit 337, or stored in a separate memory chip (the memory chip is not shown in FIG. 3), which is not limited in this embodiment.

In an embodiment, when the actual voltage value of the input port 310 is less than the preset voltage value, which means that the set value for current load capability at this time exceeds load capability of the input port 310, the control circuit 331 may output a first control signal by the enable output end C, communicate and negotiate with an end of the load through the USB PD protocol so as to adjust the set value for current load capability. The actual voltage value of the input port 310 under the adjusted set value for current load capability is re-acquired, and the above-mentioned comparison process is continued by the comparison circuit 337 until the actual voltage of the input port 310 corresponding to the adjusted set value for current load capability is not less than the preset voltage value. When the actual voltage value of the input port 310 corresponding to the adjusted set value for current load capability is not less than the preset voltage value, the control circuit 331 may output a second control signal by the enable output end C, and the output port 320 outputs the adjusted set value for current load capability as the load capability of the power supply.

In an embodiment, the switch circuit 332 is connected to a VBUS, and the enable output end C of the control circuit 331 is connected to the enable input end D of the switch circuit 332.

In an embodiment, the voltage detection circuit 333 is connected between the VBUS and a ground and is connected to the voltage acquisition port 336 of the control circuit 331, and the voltage detection circuit 333 may be configured to: detect the actual voltage value of the input port 310 and send the actual value of the input port 310 to the voltage acquisition port 336 of the control circuit 331.

In an embodiment, after the input port 310 is connected to the power supply while the output port 320 is connected to the load (that is, after the input port of the USB connection line is connected to the power supply and the output port of the USB connection line is connected to the load), the switch circuit 332 is in a turn-on state. The set value sending port 335 of the control circuit 331 may transmit a load current to the output port 320 to detect the set value for current load capability, meanwhile, the voltage detection circuit 333 may detect the actual voltage value of the input port 310. The set value sending port 335 of the control circuit 331 receives a signal detected by the voltage detection circuit 333, which is compared with the preset voltage value stored in the control circuit 331 to form a control signal, and the control signal is output by the enable output end C of the control circuit 331. When the actual voltage value of the input port 310 is less than the preset voltage value, the control circuit 331 may output the first control signal by the enable output end C, the first control signal may cause the switch circuit 332 to be in a turn-off state, that is, an access load is reset, where the reset may include that a connection between the input port 310 and the output port 320 in the USB connection line is disconnected. After the set value for current load capability is adjusted, the connection between the input port 310 and the output port 320 may be restored to obtain the adjusted set value for current load capability, and the actual voltage value of the input port is detected, the above process is repeated. When the actual voltage value of the input port 310 is not less than the preset voltage value, the control circuit 331 may output the second control signal by the enable output end C, where the second control signal may cause the switch circuit 332 to be in the turn-on state to restore the connection between the input port 310 and the output port 320.

In this embodiment, the actual voltage value of the input port is detected by the voltage detection circuit, and the control circuit compares the actual voltage value of the input port with the preset voltage value to form the control signal so as to control the switch circuit to be turned on or off, such that the USB-type converter in this embodiment can provide electric energy to the output port (that is, power is supplied to the load) without damaging the input port, thus the intelligent charging is achieved.

Figure 4:
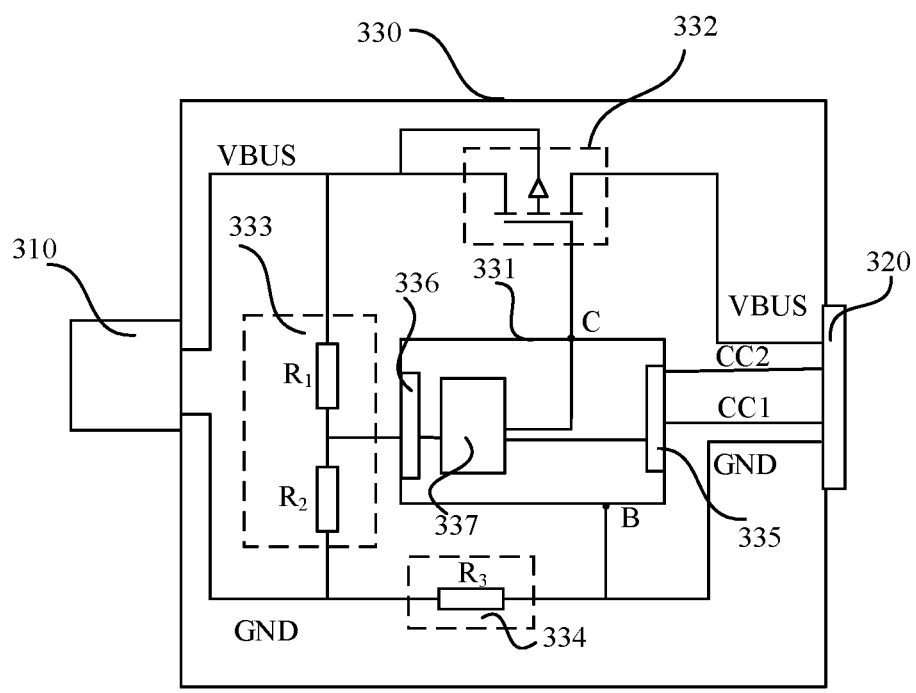
FIG. 4 is a schematic diagram of an internal structure of a USB-type converter according to yet another embodiment.

FIG. 4 is a schematic diagram of an internal structure of a USB-type converter according to an embodiment. In an embodiment, the USB-type converter may further include the input port 310, the output port 320, the power supply load capability estimation unit 330, the control circuit 331, the switch circuit 332, the voltage detection circuit 333, the set value sending port 335, the voltage acquisition port 336, the comparison circuit 337, a second input end B and the enable output end C.

FIG. 4 shows a schematic diagram of internal components of the switch circuit 332 and the voltage detection circuit 333. In an embodiment, FIG. 4 may further include a current detection circuit 334 and the second input end B of the control circuit 331. Herein, the voltage detection circuit 333 may include a first resistor $R_1$ and a second resistor $R_2$; the switch circuit 332 may include a P-type MOS transistor; and the current detection circuit 334 may include a third resistor $R_3$.

In an embodiment, the first resistor $R_1$ and the second resistor $R_2$ may be connected in series. One end of the series-connected resistors may be connected to the VBUS, and the other end of the series-connected resistors may be connected to the ground. The voltage acquisition port 336 may be connected between the first resistor $R_1$ and the second resistor $R_2$.

In an embodiment, an actual voltage output by the input port 310 may be loaded on both ends of the voltage detection circuit 333, the first resistor $R_1$ and the second resistor $R_2$ may perform a voltage division on the actual voltage value of the input port 310, and functions of the control circuit 331 may be implemented by the control circuit 331 using a control chip (not shown in FIG. 4). The control chip may be arranged in the control circuit 331, which for example may be connected to at least one of the voltage detection circuit 336, the comparison circuit 337 or the set value sending port 335. As shown in FIG. 4, since the first resistor $R_1$ and the second resistor $R_2$ perform the voltage division on the actual voltage value of the input port 310, which leads that a voltage value input to the control chip may be a voltage value on the second resistor $R_2$.

Examples for the internal structure of the voltage detection circuit 333 and the control circuit 331 in this embodiment are merely examples, rather than limitations, and other devices that may achieve same functions are also within the protection scope of the embodiments of the present disclosure.

In an embodiment, as shown in FIG. 4, the switch circuit 332 may exemplarily be a P-type MOS transistor. The P-type MOS transistor divides the VBUS into two parts, a source electrode of the P-type MOS transistor may be connected to the input port 310 through a part of the VBUS, and a drain electrode of the P-type MOS transistor may be connected to the output port 320 through the other part of the VBUS, a gate electrode of the P-type MOS transistor may be connected to the enable output end C of the control circuit 331. For example, when the actual voltage value of the input port 310 is less than the preset voltage value, the first control signal output by the enable output end C of the control circuit 331 is at a high level, so that the P-type MOS transistor is in a turn-off state; when the actual voltage value of the input port 310 is not less than the preset voltage value, the second control signal output by the enable output end C of the control circuit 331 is at a low level, so that the P-MOS transistor is in a turn-on state. In an embodiment, the switch circuit 332 may also be an N-type MOS transistor, then the corresponding first control signal may be at the low level, and the second control signal may be at the high level.

In an embodiment, the switch circuit 332 may also be other devices that may implement the functions of the switch circuit 332, such as a triode, a relay or a triac. In an embodiment, when the switch circuit 332 is a different device, the high or low level of the control signal may be adjusted to control the turn-on or turn-off state of the switch circuit 332.

In an embodiment, as shown in FIG. 4, the control circuit 331 may further include the second input end B.

In an embodiment, the power supply load capability estimation unit 330 may further include the current detection circuit 334.

The current detection circuit 334 may be configured to detect an actual value for current load capability of the output port 320 and send the actual value to the control circuit 331, so that the comparison circuit 337 of the control circuit 331 determines whether the actual value for current load capability of the output port 320 reaches the set value for current load capability, when the actual value for current load capability of the output port 320 reaches the set value for current load capability, the voltage detection circuit 333 detects the actual voltage value of the input port 310.

In an embodiment, when the actual value for current load capability of the output port 320 detected by the current detection circuit 334 is less than the set value for current load capability, load capability provided by the input port 310 may not satisfy load capability required by the output port 320. At this time, a control signal output by the control circuit 331 may be the first control signal to turn off the switch circuit 332. When the actual value for current load capability of the output port 320 detected by the current detection circuit 334 reaches the set value for current load capability, the load capability provided by the input port 310 satisfies the load capability required by the output port 320. At this time, the control signal output by the control circuit 331 may be the second control signal to turn on the switch circuit 332, and the output port 320 receives the actual voltage value of the input port 310. That is, when an initial load current value of the output port 320 detected by the current detection circuit 334 is greater than a current value defined by the load, the power supply may not normally supply power. Therefore, the control circuit 331 may output the first control signal to control the switch circuit 332 to be turned off, and the initial load current value is adjusted. When the initial load current value is adjusted, the control circuit 331 may output the second control signal to control the switch circuit 332 to be turned on. When the load current value of the output port 320 detected by the current detection circuit 334 is less than the current value specified by the load, the power supply may normally supply power to the load and detect the actual voltage value of the input port 310.

The current detection circuit 334 may be connected to the VBUS or the GND, so that the current detection circuit 334 and the load may form a series branch. The second input end B may be connected between the current detection circuit 334 and the output port 320, so that a current detected by the current detection circuit 334 is output to the control circuit 331 so as to enable the comparison circuit 337 to compare the received load current.

Since the current detection circuit 334 and the load form the series branch, a current passing through the current detection circuit 334 is equal to a current passing through the load.

With continued reference to FIG. 4, the current detection circuit 334 may include the third resistor $R_3$. The third resistor $R_3$ may be connected to the VBUS or the GND in series. The second input end B of the control circuit 331 may be connected between the third resistor $R_3$ and the output port 320. In an embodiment, as shown in FIG. 4, a resistance value of the third resistor $R_3$ may be set as a fixed value, and the third resistor $R_3$ is connected to the GND in series. After the resistance value of the third resistor $R_3$ is determined, a signal output by the current detection circuit 334 to the second input end B of the control circuit 331 may be determined by the current value.

In an embodiment, the current detection circuit 334 in FIG. 4 only exemplarily shows the third resistor $R_3$. In an embodiment, the current detection circuit 334 may be $R_3$ or other electronic devices.

In an embodiment, a control line CC1 and a control line CC2 in FIG. 4 may be configured to connect the set value sending port 335 and the output port 320.

In this embodiment, the current detection circuit is configured to detect the initial load current value of the output port, and the initial load current is adjusted when it does not satisfy the condition, so that the power supply may normally supply power to the load.

Figure 5:
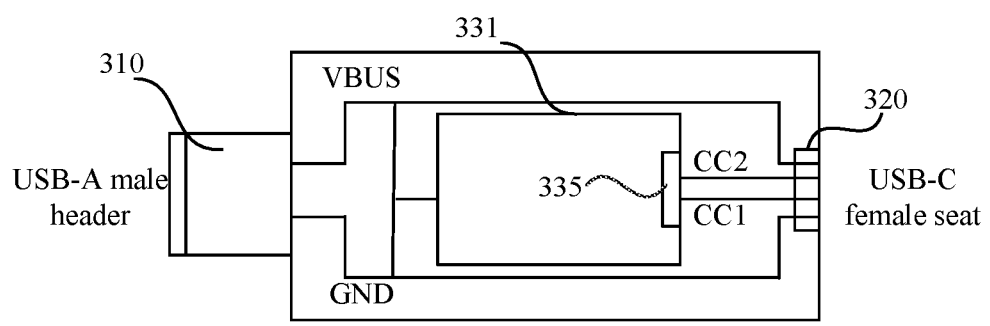
FIG. 5 is a schematic structural diagram of a USB-type converter according to an embodiment.

FIG. 5 is a schematic structural diagram of a USB-type converter according to an embodiment. In an embodiment, the input port 310 may exemplarily be a USB-A male header, and the output port 320 may be a USB-C female seat. At this time, the functions of the USB-type converter may include that power is intelligently supplied to the USB-C female seat while it is ensured that the USB-A male header is not damaged, a charger converting an A-type USB charger interface into a C-type USB interface is realized, power supply capability of the A-type USB charger may be dynamically estimated, and power supply capability is informed to an electrical appliance, so as to maximize utilization of the A-type USB charger.

In an embodiment, when the output port 320 is the USB-C female seat, the set value sending port 335 of the control circuit 331 may send the set value for current load capability to the output port 320 through the first control line CC1 or the second control line CC2 of the USB-C female seat.

In an embodiment, the input port 310 in the above embodiments may include one or more of a USB-A male header, a USB-B male header, a USB-C male header, a lightning interface male header, a micro USB female seat or a lightning female seat.

Figure 6:
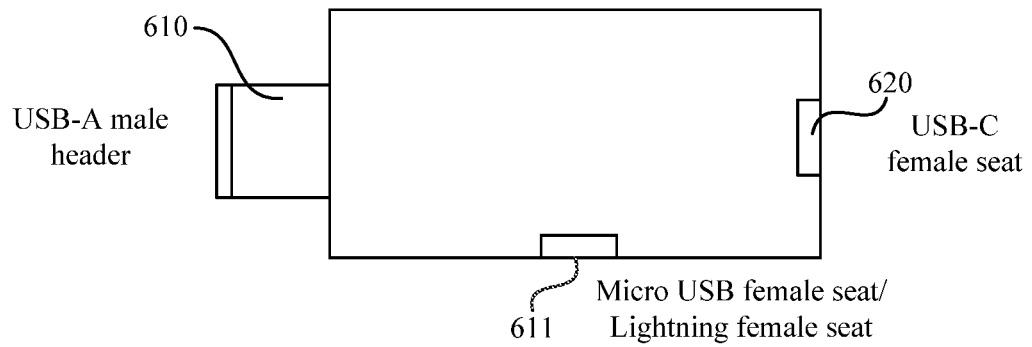
FIG. 6 is a schematic structural diagram of a USB-type converter according to another embodiment.

FIG. 6 is a schematic structural diagram of another USB-type converter according to an embodiment of the present disclosure. In an embodiment, there may be multiple input ports. As shown in FIG. 6, there may be two input ports, including an input port 610 and an input port 611; and there is one output port, an output port 620. The input port 610 may be a USB-A male header, the input port 611 may be any one of a micro USB female seat or a lightning female seat.

In an embodiment, since each of the input port 610 and the input port 611 respectively corresponds to one power supply, the actual voltage value of the input port may be a sum of actual voltage values detected by the input port 610 and the input port 611. The preset voltage value stored in the control circuit may be a sum of voltage values corresponding to power supplies respectively connected to the input port 610 and the input port 611.

In an embodiment, when the input port 610 and the input port 611 are C-type USB interfaces, the functions of the USB-type converter in this embodiment may implement conversion of load capability between the C-type USB interfaces.

The USB-type converter provided by this embodiment may intelligently supply power to a USB-C female seat while it is ensured that the USB-A male header and the micro USB female seat or the Lightning female seat are not damaged. In addition, when the actual voltage value of the input port is not less than the preset voltage value, the USB-type converter according to this embodiment increases the set value for current load capability, improves the power supply capability for the load, and realizes the functions of the charger converting an interface of a A-type USB charger interface, a micro USB female seat charger interface or a lightning charger interface into a C-type USB interface.

Figure 7:
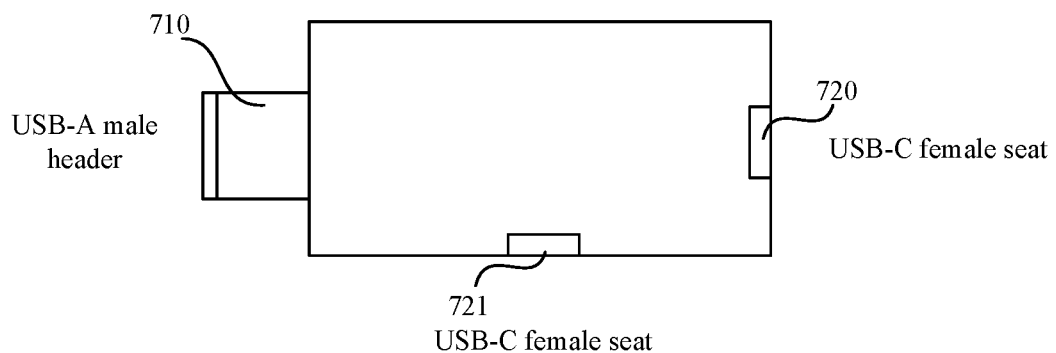
FIG. 7 is a schematic structural diagram of another USB-type converter according to yet another embodiment.

FIG. 7 is a schematic structural diagram of another USB-type converter provided by an embodiment of the present disclosure. In an embodiment, there are multiple output ports. As shown in FIG. 7, there may be one input port, an input port 710, and two output ports, including an output port 720 and an output port 721. The input port 710 may be a USB-A male header, and each of the output port 720 and the output port 721 may be a USB-C female seat.

In an embodiment, the output port 720 and the output port 721 are connected to loads in one-to-one correspondence, therefore when the power supply supplies power to the loads, a detected set value for current load capability may be a sum of sub-set values for current load capability corresponding to the two USB-C female seats (i.e., the output port 720 and the output port 721).

The USB-type converter provided by this embodiment may intelligently supply power to the two USB-C female seats at the same time while it is ensured that the USB-A male header is not damaged, so that a charger converting an A-type USB charger interface into a C-type USB interface may be achieved, multiple loads may be charged at the same time, thereby the functions of the charger are strengthened.

Figure 8:
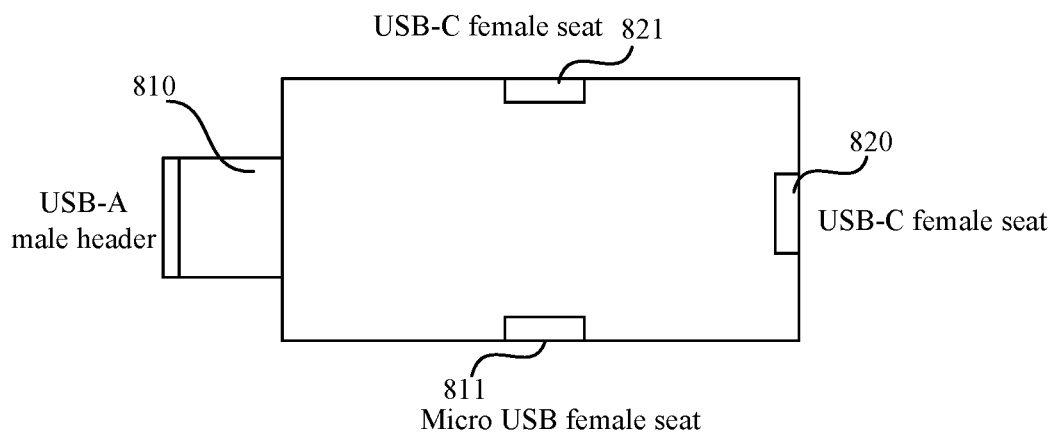
FIG. 8 is a schematic structural diagram of another USB-type converter according to yet another embodiment.

FIG. 8 is a schematic structural diagram of another USB-type converter according to an embodiment of the present disclosure. In an embodiment, there may be multiple input ports, and multiple output ports. As shown in FIG. 8, there may be two input ports, including an input port 810 and an input port 811, while there are two input ports, including an output port 820 and an output port 821. The input port 810 may be a USB-A male header, and the input port 811 may be a micro USB female seat, and the input port 810 and the input port 811 are respectively connected to two power supplies in one-to-one correspondence. Each of the output port 820 and the output port 821 may be a USB-C female seat, the two output ports are respectively connected to the loads in one-to-one correspondence.

In an embodiment, a sum of an actual voltage value of the USB-A male header and an actual voltage value of the micro USB female seat is the actual voltage value of the input port, and the preset voltage value stored in the control circuit is a sum of voltage values corresponding to the two power supplies respectively connected to the two input ports. A sum of the sub-set values for current load capability corresponding to the two USB-C female seats is equal to the set value for current load capability. That is, the actual voltage value of the input port may be a sum of actual voltage values detected by the input port 810 and the input port 811, and the preset voltage value stored in the control circuit may be a sum of voltage values corresponding to the power supplies respectively connected to the input port 810 and the input port 811. The detected set value for current load capability may be a sum of sub-set values for current load capability corresponding to the output port 820 and the output port 821.

The USB-type converter provided by this embodiment may intelligently supply power to multiple USB-C female seats while it is ensured that the USB-A male header and the micro USB female seat are not damaged, thereby the power supply capability for a load is increased. In addition, the USB-type converter according to this embodiment may charge multiple loads at the same time, and a charger which may convert an A-type USB charger interface and a micro USB female seat charger interface into multiple C-type USB interfaces is achieved.

What is claimed is:

1. A method for estimating a load current of a power supply, applied to a universal serial bus (USB) connection line, comprising:
    after an input port of the USB connection line is connected to the power supply and an output port of the USB connection line is connected to a load, supplying, by the power supply, power to the load through the USB connection line to obtain an initial load current value;
    detecting an actual voltage value of the input port;
    determining that the actual voltage value of the input port is less than a preset voltage value; wherein the input port includes at least one input port; in a case where one input port is connected to a power supply, the actual voltage value of the input port is an actual voltage value of the one input port, and the preset voltage value is a default voltage value corresponding to the power supply which is connected to the one input port; and in a case where at least two input ports are connected to at least two power supplies in one-to-one correspondence, the actual voltage value of the input port is a sum of actual voltage values of the at least two input ports, and the preset voltage value is a sum of default voltage values corresponding to the at least two power supplies;
    adjusting the initial load current value until the actual voltage value of the input port corresponding to an adjusted load current value is greater than or equal to the preset voltage value; and
    outputting the adjusted load current value as a load current value of the power supply.

2. The method of claim 1, wherein
    before adjusting the initial load current value each time, the method further comprises:
    disconnecting a connection between the input port and the output port in the USB connection line; and
    before obtaining the actual voltage value of the input port corresponding to the adjusted load current value each time, the method further comprises: restoring the connection between the input port and the output port in the USB connection line.

3. The method of claim 1, wherein the output port includes at least one output port;
    in a case where one output port is connected to a load, power is supplied to the load connected to the one output port to obtain the initial load current value; and
    in a case where at least two output ports are connected to at least two loads in one-to-one correspondence, power is supplied to the at least two loads connected to the at least two output ports to obtain at least two sub-initial load current values, wherein the initial load current value is a sum of the at least two sub-initial load current values.

4. A universal serial bus (USB)-type converter, comprising an input port, an output port and a power supply load capability estimation unit, wherein
    the input port is configured to be connected to a power supply;
    the output port is configured to be connected to a load; and
    the power supply load capability estimation unit is configured to: in a case where the power supply supplies power to the load through a USB connection line to obtain an initial load current value, detect an actual voltage value of the input port; in a case where the actual voltage value of the input port is less than a preset voltage value, adjust the initial load current value until the actual voltage value of the input port corresponding to an adjusted load current value is greater than or equal to the preset voltage value, and output the adjusted load current value as a load current value of the power supply;
    wherein the power supply load capability estimation unit comprises a control circuit, a switch circuit and a voltage detection circuit;
    wherein the control circuit comprises a set value sending port, a voltage acquisition port, an enable output end and a comparison circuit; the set value sending port is connected to the output port; the voltage acquisition port, which serves as a first input end of the control circuit, is connected to the voltage detection circuit and is configured to acquire the actual voltage value of the input port; and the comparison circuit is connected to the voltage acquisition port and is configured to:

receive the actual voltage value of the input port, and compare the actual voltage value of the input port with the preset voltage value stored in the control circuit to form a control signal which is output by the enable output end of the control circuit;

wherein in a case where the actual voltage value of the input port is less than the preset voltage value, the enable output end of the control circuit outputs a first control signal to adjust the initial load current value and obtain an adjusted load current value; and in a case where the actual voltage value of the input port is greater than or equal to the preset voltage value, the enable output end of the control circuit outputs a second control signal;

wherein the switch circuit is connected to a voltage bus, the enable output end of the control circuit is connected to an enable input end of the switch circuit; and wherein the voltage detection circuit, which is connected between the voltage bus and a ground and connected to the voltage acquisition port of the control circuit, is configured to detect the actual voltage value of the input port and send the actual voltage value of the input port to the voltage acquisition port of the control circuit.

5. The USB-type converter of claim 4, wherein the voltage detection circuit comprises a first resistor and a second resistor, wherein the first resistor and the second resistor are connected in series, and one end of the series-connected resistors is connected to the voltage bus, the other end of the series-connected resistors is connected to the ground, and the voltage acquisition port is connected between the first resistor and the second resistor.

6. The USB-type converter of claim 4, wherein the control circuit further comprises a second input end;

wherein the power supply load capability estimation unit further comprises:

a current detection circuit, which is configured to detect an actual load current value of the output port and send the actual load current value to the second input end of the control circuit, such that the control circuit determines whether the actual load current value reaches the initial load current value; in a case where the actual load current value reaches the initial load current value, the voltage detection circuit detects the actual voltage value of the input port;

wherein the current detection circuit is connected to the voltage bus or the ground, such that the current detection circuit and the load form a series branch, the second input end of the control circuit is connected between the current detection circuit and the output port.

7. The USB-type converter of claim 4, wherein the input port includes at least one of a USB-A male header, a USB-B male header, a USB-C male header, a lightning interface male header, a micro USB female seat or a lightning female seat.

8. The USB-type converter of claim 4, wherein the output port is a USB-C female seat; and the set value sending port of the control circuit outputs a load current through a first control line or a second control line of the USB-C female seat.

9. The method of claim 2, wherein the output port includes at least one output port;

in a case where one output port is connected to a load, power is supplied to the load connected to the one output port to obtain the initial load current value; and in a case where at least two output ports are connected to at least two loads in one-to-one correspondence, power is supplied to the at least two loads connected to the at least two output ports to obtain at least two sub-initial load current values, wherein the initial load current value is a sum of the at least two sub-initial load current values.

10. The USB-type converter of claim 5, wherein the control circuit further comprises a second input end;

wherein the power supply load capability estimation unit further comprises:

a current detection circuit, which is configured to detect an actual load current value of the output port and send the actual load current value to the second input end of the control circuit, such that the control circuit determines whether the actual load current value reaches the initial load current value; in a case where the actual load current value reaches the initial load current value, the voltage detection circuit detects the actual voltage value of the input port;

wherein the current detection circuit is connected to the voltage bus or the ground, such that the current detection circuit and the load form a series branch, the second input end of the control circuit is connected between the current detection circuit and the output port.

11. The USB-type converter of claim 5, wherein the input port includes at least one of a USB-A male header, a USB-B male header, a USB-C male header, a lightning interface male header, a micro USB female seat or a lightning female seat.

12. The USB-type converter of claim 6, wherein the input port includes at least one of a USB-A male header, a USB-B male header, a USB-C male header, a lightning interface male header, a micro USB female seat or a lightning female seat.

13. The USB-type converter of claim 5, wherein the output port is a USB-C female seat; and the set value sending port of the control circuit outputs a load current through a first control line or a second control line of the USB-C female seat.

14. The USB-type converter of claim 6, wherein the output port is a USB-C female seat; and the set value sending port of the control circuit outputs a load current through a first control line or a second control line of the USB-C female seat.

15. The USB-type converter of claim 7, wherein the output port is a USB-C female seat; and the set value sending port of the control circuit outputs a load current through a first control line or a second control line of the USB-C female seat.

* * * * *